(12) United States Patent
Pei et al.

(10) Patent No.: US 9,373,548 B2
(45) Date of Patent: Jun. 21, 2016

(54) CMOS CIRCUIT HAVING A TENSILE STRESS LAYER OVERLYING AN NMOS TRANSISTOR AND OVERLAPPING A PORTION OF COMPRESSIVE STRESS LAYER

(75) Inventors: Gen Pei, Yorktown Heights, NY (US); Scott D. Luning, Poughkeepsie, NY (US); Johannes van Meer, Newburgh, NY (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 1084 days.

(21) Appl. No.: 12/199,659

(22) Filed: Aug. 27, 2008

(65) Prior Publication Data
US 2009/0008718 A1 Jan. 8, 2009

Related U.S. Application Data

(62) Division of application No. 11/532,753, filed on Sep. 18, 2006, now Pat. No. 7,442,601.

(51) Int. Cl.
H01L 27/092 (2006.01)
H01L 21/8238 (2006.01)
H01L 21/84 (2006.01)
H01L 29/78 (2006.01)

(52) U.S. Cl.
CPC ........ H01L 21/823807 (2013.01); H01L 21/823878 (2013.01); H01L 21/84 (2013.01); H01L 27/092 (2013.01); H01L 29/7843 (2013.01)

(58) Field of Classification Search
CPC ................ H01L 27/092; H01L 29/7843

USPC ..................... 257/369, E27.062, 351
See application file for complete search history.

(56) References Cited

U.S. PATENT DOCUMENTS

| | | | |
|---|---|---|---|
| 6,627,512 B2 * | 9/2003 | Iwamatsu et al. | 438/424 |
| 7,164,163 B2 | 1/2007 | Chen et al. | |
| 7,214,629 B1 | 5/2007 | Luo et al. | |
| 7,271,045 B2 | 9/2007 | Prince et al. | |
| 7,417,289 B2 * | 8/2008 | Tsutsui et al. | 257/369 |
| 7,585,720 B2 * | 9/2009 | Sudo | 438/199 |
| 2003/0181005 A1 * | 9/2003 | Hachimine et al. | 438/231 |
| 2005/0116360 A1 | 6/2005 | Huang et al. | |
| 2005/0214998 A1 * | 9/2005 | Chen et al. | 438/199 |
| 2006/0003597 A1 * | 1/2006 | Golonzka et al. | 438/778 |
| 2006/0024879 A1 | 2/2006 | Fu et al. | |
| 2006/0160317 A1 | 7/2006 | Zhu et al. | |
| 2006/0220113 A1 | 10/2006 | Tamura et al. | |
| 2006/0286729 A1 | 12/2006 | Kavalieros et al. | |

(Continued)

OTHER PUBLICATIONS

Notice of Allowance for Utility U.S. Appl. No. 12/208,196 mailed Feb. 16, 2011.

*Primary Examiner* — Anh Mai
(74) *Attorney, Agent, or Firm* — Park, Vaughan, Fleming & Dowler LLP

(57) ABSTRACT

A CMOS circuit is provided that includes a PMOS transistor, an NMOS transistor adjacent the PMOS transistor in a channel width direction, a compressive stress liner overlying the PMOS transistor, and a tensile stress liner overlying the NMOS transistor. A portion of the compressive stress liner and a portion of the tensile stress liner are in a stacked configuration, and an overlap region of the compressive stress liner and the tensile stress liner is sufficient to result in an enhanced transverse stress in the compressive stress liner or the tensile stress liner.

3 Claims, 7 Drawing Sheets

(56) References Cited

U.S. PATENT DOCUMENTS

| | | |
|---|---|---|
| 2007/0045747 A1 | 3/2007 | Kohyama |
| 2007/0099414 A1 | 5/2007 | Frohberg et al. |
| 2007/0108526 A1 | 5/2007 | Kohyama |
| 2007/0120197 A1 | 5/2007 | Zhu et al. |
| 2007/0138570 A1 | 6/2007 | Chong et al. |
| 2007/0246776 A1 | 10/2007 | Moroz et al. |
| 2007/0290192 A1 | 12/2007 | Rotondaro |
| 2008/0012019 A1 | 1/2008 | Zhu et al. |
| 2008/0014704 A1 | 1/2008 | Peidous et al. |

\* cited by examiner

CMOS CIRCUIT HAVING A TENSILE STRESS LAYER OVERLYING AN NMOS TRANSISTOR AND OVERLAPPING A PORTION OF COMPRESSIVE STRESS LAYER

CROSS-REFERENCES TO RELATED APPLICATIONS

This application is a division of U.S. Pat. No. 7,442,601 B2, which issued on Oct. 28, 2008.

TECHNICAL FIELD

The present invention generally relates to CMOS circuits and to methods for their manufacture, and more particularly relates to stress enhanced CMOS circuits and to dual stress liner methods for their manufacture.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain regions.

The gain of an MOS transistor, usually defined by the transconductance ($g_m$), is proportional to the mobility ($\mu$) of the majority carrier in the transistor channel. The current carrying capability and hence the performance of an MOS transistor is proportional to the mobility of the majority carrier in the channel. The mobility of holes, the majority carrier in a P-channel MOS (PMOS) transistor, and the mobility of electrons, the majority carrier in an N-channel MOS (NMOS) transistor, can be enhanced by applying an appropriate stress to the channel. The known stress engineering methods greatly enhance circuit performance by increasing device drive current without increasing device size and device capacitance. It is known, for example, that a tensile stress liner applied to an NMOS transistor induces a longitudinal stress in the channel and enhances the majority carrier electron mobility, but a tensile stress liner applied to a PMOS transistor results in a decrease in majority carrier hole mobility. Similarly, a compressive stress liner applied to a PMOS transistor induces a compressive stress in the channel and enhances the hole mobility, but if applied to an NMOS transistor the compressive stress liner decreases majority carrier electron mobility. As ICs become larger and larger, the size of individual transistors shrinks and the spacing between NMOS and PMOS transistors also shrinks. As the spacing between NMOS and PMOS transistors becomes smaller, the interaction between tensile and compressive liners becomes more and more important. The interaction between different stress liners can adversely affect the mobility enhancement potentially available from use of the liners.

Accordingly, it is desirable to provide optimized methods for fabricating high density CMOS circuits using dual stress liners to enhance mobility in both NMOS and PMOS transistors. In addition, it is desirable to provide stress enhanced CMOS circuits fabricated with dual stress liners. Furthermore, other desirable features and characteristics of the present invention will become apparent from the subsequent detailed description and the appended claims, taken in conjunction with the accompanying drawings and the foregoing technical field and background.

BRIEF SUMMARY

A stress enhanced CMOS circuit is provided. The stress enhanced CMOS circuit comprises a PMOS transistor and an NMOS transistor adjacent the PMOS transistor in a channel width direction and separated from the PMOS transistor by an isolation region. A compressive stress liner overlies the PMOS transistor and a first portion of the isolation region and a tensile stress liner overlies the NMOS transistor, a second portion of the isolation region, and an edge portion of the compressive stress liner.

Methods are provided for the fabrication of a stress enhanced CMOS circuit. One fabrication method comprises the steps of forming an NMOS transistor and a PMOS transistor adjacent the NMOS transistor in a channel width direction, the PMOS transistor and the NMOS transistor separated by an isolation region. A compressive stress liner is deposited overlying the transistors and the isolation region and is etched to remove the compressive stress liner from the NMOS transistor and from a portion of the isolation region. A tensile stress liner is deposited overlying the transistors, the isolation region, and the compressive stress liner and is etched to remove a portion of the tensile stress liner overlying a portion of the compressive stress liner and to leave the tensile stress liner overlying the NMOS transistor, the isolation region, and a portion of the compressive stress liner.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
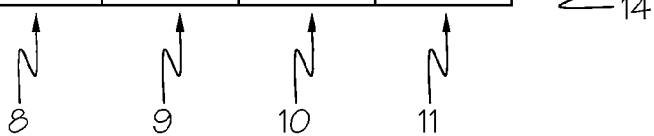
FIG. 1 shows in table form the mobility change resulting from a stress applied to the channel of an MOS transistor in various directions.

FIG. 1 shows the mobility change resulting from a stress of 1 Giga Pascal (GPa) applied to the channel of an MOS transistor in various directions. The results shown in the figure apply to an MOS transistor channel formed in a (100) silicon wafer and oriented in a [110] crystal direction. Columns 8 and 9 relate to the application of a tensile stress applied to the channel of an NMOS transistor and to a PMOS transistor, respectively. In like manner columns 10 and 11 relate to the application of a compressive stress applied to the channel of an NMOS transistor and to a PMOS transistor, respectively. Row 12 indicates the result of application of the stress in the longitudinal direction along the channel length; row 13 indicates the result of application of the stress in the transverse direction along the channel width; and row 14 indicates the result of application of the stress in a direction perpendicular to the plane of the channel. It is readily apparent that application of a stress, either tensile or compressive, applied to the channel of an MOS transistor can either enhance or degrade the majority carrier mobility depending on the direction of application of the stress and whether the majority carrier is a hole or an electron.

FIGS. 2-12 illustrate a stress enhanced CMOS circuit 30 and method steps for its fabrication in accordance with various embodiments of the invention. In this exemplary embodiment only one NMOS transistor 32 and one PMOS transistor 34 will be illustrated. Stress enhanced CMOS circuit 30 may include a plurality of stress enhanced NMOS and/or PMOS transistors with or without conventional MOS transistors coupled together to implement a desired integrated circuit. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 2:
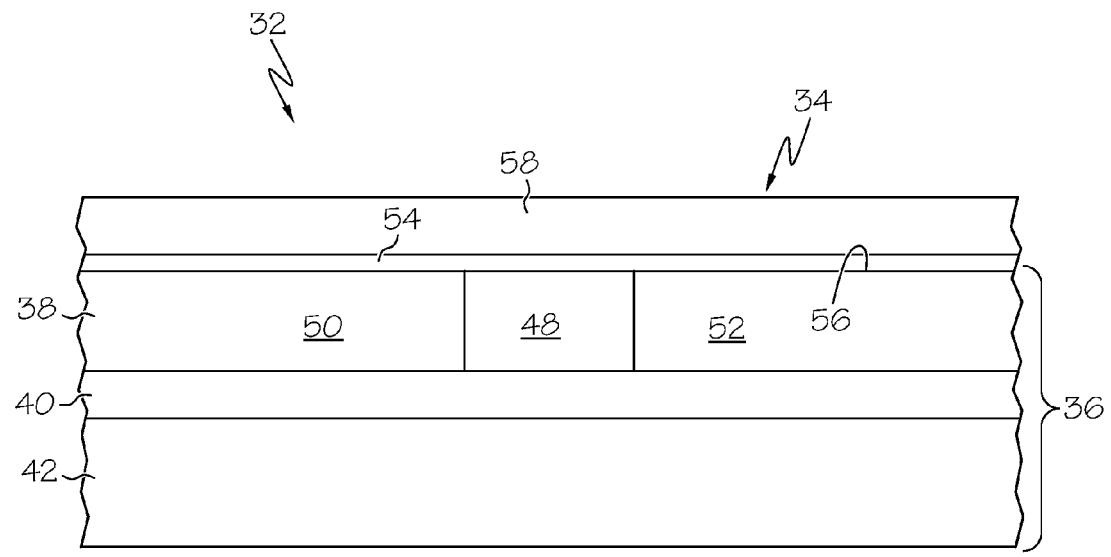
FIGS. 2, 3, and 5-12 illustrate, in cross section, method steps for fabricating a stress enhanced CMOS circuit in accordance with an embodiment of the invention.

As illustrated in cross section in FIG. 2, the manufacture of stress enhanced CMOS circuit 30 in accordance with an embodiment of the invention begins with providing a semiconductor substrate 36 in and on which stress enhanced MOS transistors 32 and 34 are fabricated. The initial steps in the fabrication of MOS circuit 30 are conventional and will not be described in detail. The semiconductor substrate is preferably a silicon substrate having a (100) surface crystal orientation wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. Semiconductor substrate 36 will hereinafter be referred to for convenience but without limitation as a silicon substrate although those of skill in the semiconductor art will appreciate that other semiconductor materials could be used. Silicon substrate 36 may be a bulk silicon wafer (not illustrated), or may be a thin layer of silicon 38 on an insulating layer 40 (commonly know as silicon-on-insulator or SOI) that, in turn, is supported by a carrier wafer 42. Thin silicon layer 38 typically has a thickness of less than about 100 nanometers (nm) depending on the circuit function being implemented, and in certain applications preferably has a thickness of about 20 nm or less. The thin silicon layer preferably has a resistivity of at least about 1-35 Ohms per square. The silicon can be impurity doped either N-type or P-type, but is preferably doped P-type. Dielectric insulating layer 40, typically silicon dioxide, preferably has a thickness of about 50-200 nm.

Isolation regions 48 are formed that extend through monocrystalline silicon layer 38 to dielectric insulating layer 40. The isolation regions are preferably formed by well known shallow trench isolation (STI) techniques in which trenches are etched into monocrystalline silicon layer 38, the trenches are filled with a dielectric material such as deposited silicon dioxide, and the excess silicon dioxide is removed by chemical mechanical planarization (CMP). STI regions 48 provide electrical isolation, as needed, between various devices of the CMOS circuit that are to be formed in monocrystalline silicon layer 38. Although STI regions 48 are initially filled with a dielectric material such as silicon dioxide, especially for devices formed in very thin (less than 20 nm) silicon layers, much of that dielectric material may be removed as a consequence of the many etching steps that occur throughout the fabrication process. After fabrication of the STI regions, selected portions of silicon layer 38 can be impurity doped, for example by ion implantation. For example, P-type well 50 can be impurity doped for the fabrication of NMOS transistor 32 and N-type well 52 can be impurity doped N-type for the fabrication of PMOS transistor 34.

A layer of gate insulator 54 is formed on surface 56 of silicon layer 38. The gate insulator may be thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited in known manner, for example, by chemical vapor deposition (CVD), low pressure chemical vapor deposition (LPCVD), semi-atmospheric chemical vapor deposition (SACVD), or plasma enhanced chemical vapor deposition (PECVD). Gate insulator 54 is here illustrated as a deposited dielectric material that deposits uniformly on surface 56 of silicon layer 38 as well as on the surface of STI region 48. The gate insulator material is typically 1-10 nm in thickness. In accordance with one embodiment of the invention a layer of gate electrode forming material 58, preferably polycrystalline silicon, is deposited onto the layer of gate insulator. Other electrically conductive gate electrode forming materials such as metals and metal silicides may also be deposited providing the material by itself or with appropriate impurity doping can set the necessary threshold voltage of the transistor. The gate electrode forming material will hereinafter be referred to as polycrystalline silicon although those of skill in the art will recognize that other materials can also be employed. If the gate electrode material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation.

Figure 3:
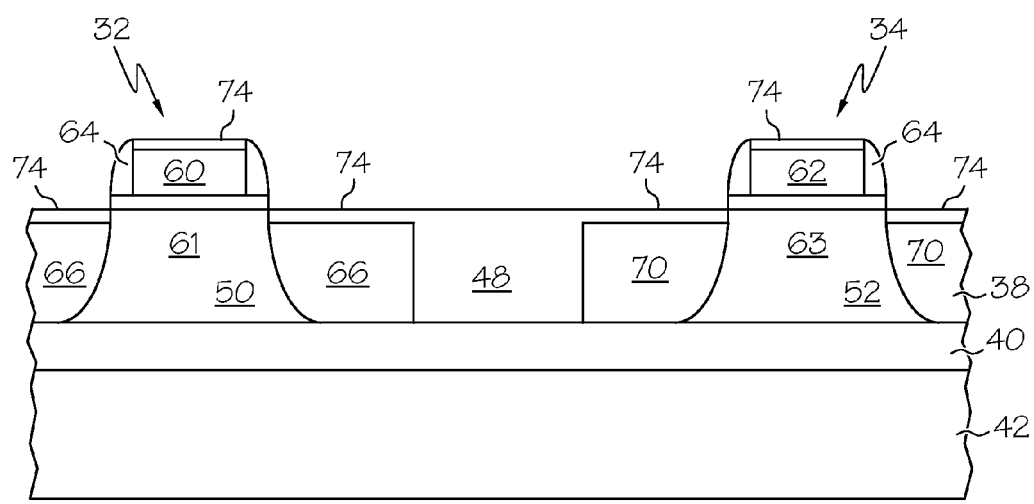

As illustrated in FIG. 3, polycrystalline silicon gate electrode forming material 58 is patterned and etched to form gate electrodes 60 and 62 for NMOS transistor 32 and PMOS transistor 34, respectively. The patterning of gate electrodes 60 and 62 defines channel region 61 of NMOS transistor in the near surface region of P-type well 50 and channel region 63 of PMOS transistor 34 in the near surface region of N-type well 52. In this figure the NMOS and PMOS transistors are illustrated as being adjacent each other in a channel length direction. Preferably the transistors are oriented on the silicon substrate so that the channel length direction is along a [110] crystalline direction. The two transistors are separated from each other by isolation region 48. The fabrication method continues in conventional manner by the formation of side wall spacers 64 on the side walls of gate electrodes 60 and 62. The side wall spacers can be formed, for example, by depositing a layer of side wall spacer material such as silicon nitride, silicon oxide, or other dielectric material and anisotropically etching that layer, for example by reactive ion etching (RIE). The gate electrodes and side wall spacers are used as ion implantation masks and conductivity determining dopant ions are implanted into exposed portions of thin silicon layer 38 to form source and drain regions 66 of NMOS transistor 32 and source and drain regions 70 of PMOS transistor 34. The source and drain regions of NMOS transistor 32 can be formed by the implantation of arsenic or phosphorous ions and the source and drain regions of PMOS transistor 34 can be formed by the implantation of boron ions as is well known. As is also well known, the PMOS transistor can be masked, for example by a layer of patterned photoresist (not illustrated) during the implantation of the NMOS transistor, and the NMOS transistor can be similarly masked during the implantation of the PMOS transistor. Although only one set of side wall spacers and one source/drain implantation have been illustrated for each transistor, those of skill in the art will recognize that additional spacers and implantations can be used to form halo implants and drain extensions, set threshold voltage, and the like. Side wall spacers 64 can also be used as an etch mask to remove any oxide or other material from the surface of the source and drain regions. This etching is one of the etching steps that may cause the removal or partial removal of the oxide in shallow trench isolation 48. After exposing the surface of the source and drain regions, a layer of silicide forming metal (not illustrated) such as nickel, cobalt, or the like is deposited. The silicide forming metal is heated, for example by rapid thermal annealing (RTA) to react the silicide forming metal with exposed silicon to form metal silicide contacts 74 on the source and drain regions 66 and 70 and on the gate electrodes 60 and 62. Metal that is not reacted, for example the metal in contact with the side wall spacers, can be removed by wet etching in a $H_2O_2/H_2SO_4$ or $HNO_3/HCl$ solution.

Figure 4:
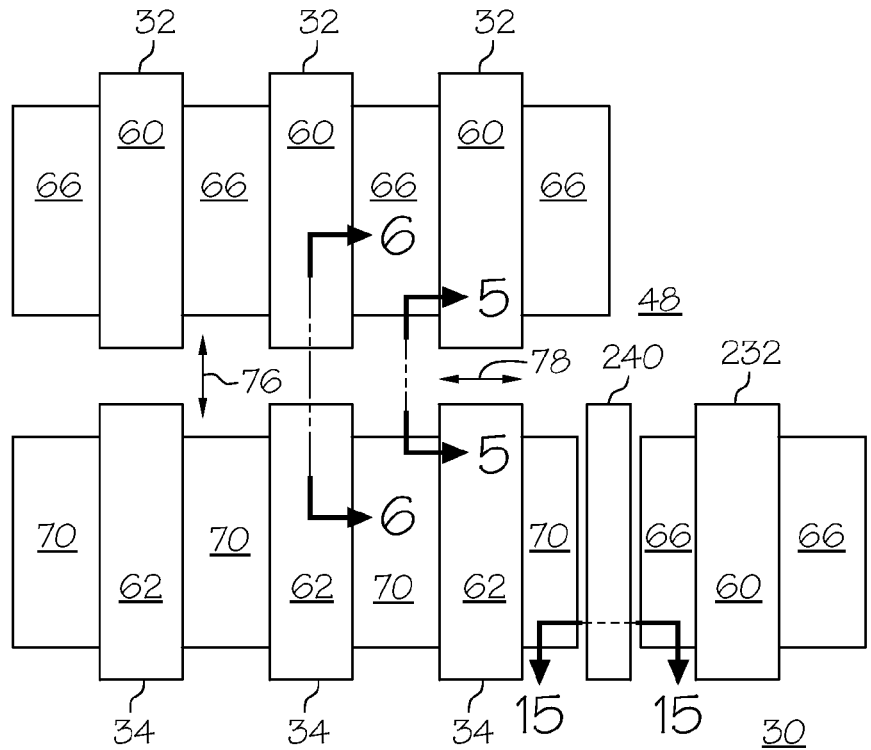
FIG. 4 illustrated in plan view a CMOS IC in accordance with an embodiment of the invention.

FIG. 4 illustrates, in plan view, a plurality of NMOS transistors 32 and a plurality of PMOS transistors 34 as part of CMOS circuit 30. The serially arranged NMOS transistors each include a gate electrode 60 and source and drain regions 66. Similarly, the serially arranged PMOS transistors each include a gate electrode 62 and source and drain regions 70. NMOS transistors 32 are separated from PMOS transistors 34 by isolation region 48. The NMOS transistors are arranged adjacent the PMOS transistors in a channel width direction indicated by arrow 76. The channel length direction is indicated by arrow 78.

Figure 5:
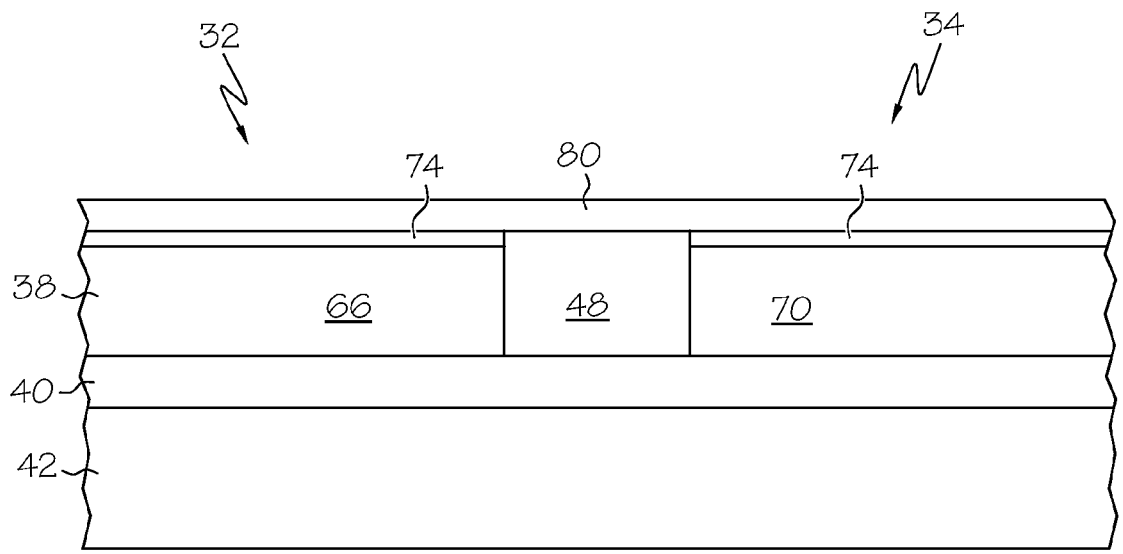
Figure 6:
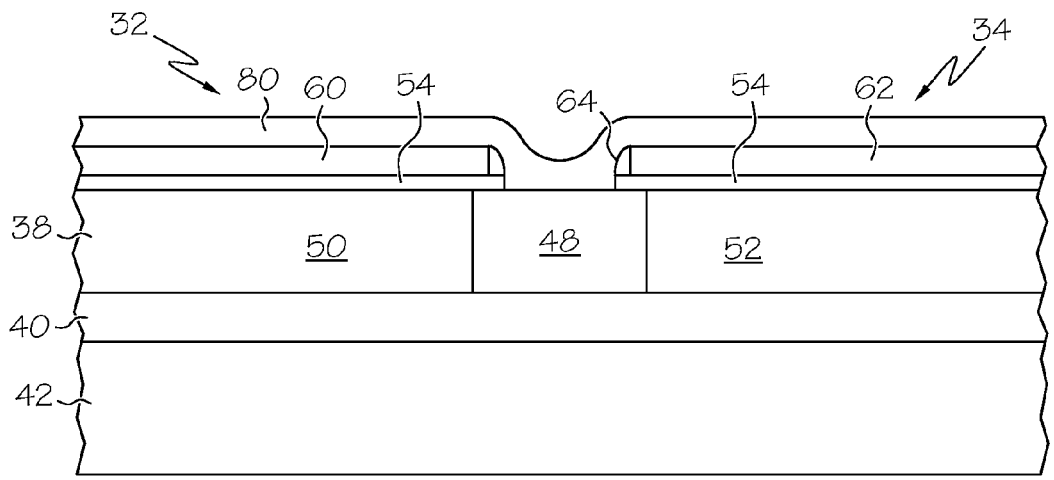

The method in accordance with an embodiment of the invention continues as illustrated in cross section in FIGS. 5 and 6 with the cross sections taken as indicated in FIG. 4. As illustrated in FIG. 5, insulating layer 40 overlies carrier wafer 42. Source/drain regions 66 of NMOS transistor 32 and 70 of PMOS transistor 34 are formed in a portion of thin silicon layer 38. A metal silicide contact region 74 is formed at the top surface of each of the source/drain regions. The source drain regions are separated by isolation region 48. As illustrated in FIG. 6, the ends of gate electrode 60 of NMOS transistor 32 and gate electrode 62 of PMOS transistor 34 with side wall spacers 64 extend over isolation region 48. In these figure the STI isolation region is illustrated as being filled with an insulating material such as silicon oxide, although the thickness of the silicon oxide in practice may be reduced and may even be completely etched away. In accordance with an embodiment of the invention, as illustrated in both FIGS. 5 and 6, a layer of compressive stressed liner material 80 is deposited to overlie the gate electrodes 60 and 62, side wall spacers 64, source/drain regions 66 and 70, and isolation region 48. The layer of compressive stressed liner material can be any compressive stressed insulating material, and preferably is a layer of compressive stressed silicon nitride having a thickness of about 40-50 nm.

Figure 7:
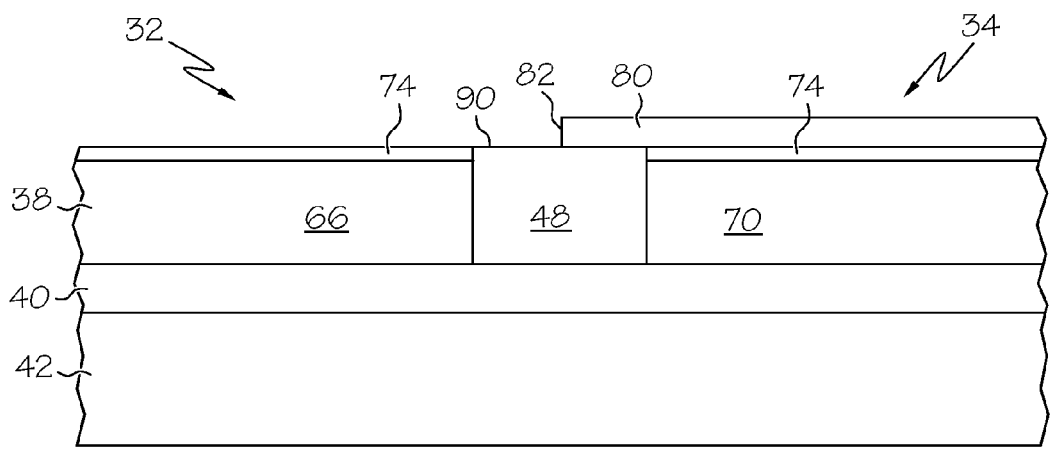
Figure 8:
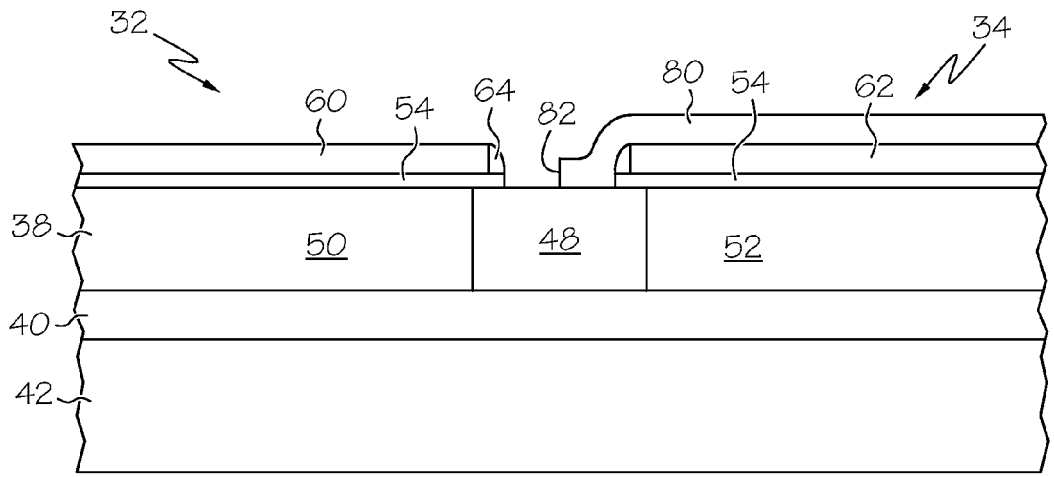

The method in accordance with an embodiment of the invention continues, as illustrated in cross section in FIGS. 7 and 8, taken along the same lines as in FIGS. 5 and 6, respectively, by the patterning and etching of compressive stressed liner material 80. The compressive stressed liner material is removed from NMOS transistor 32 and a portion of isolation region 48. Edge 82 of etched compressive liner material 80 overlies a portion of the isolation region.

Figure 9:
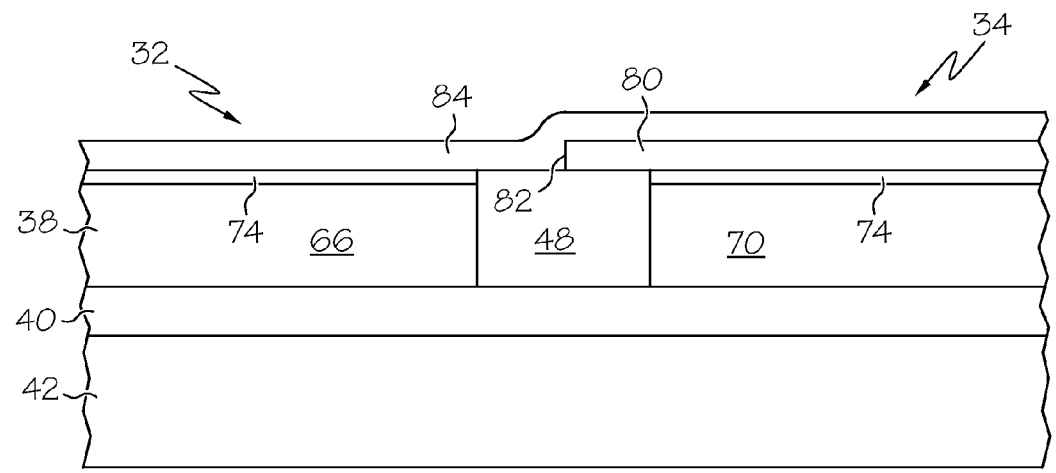
Figure 10:
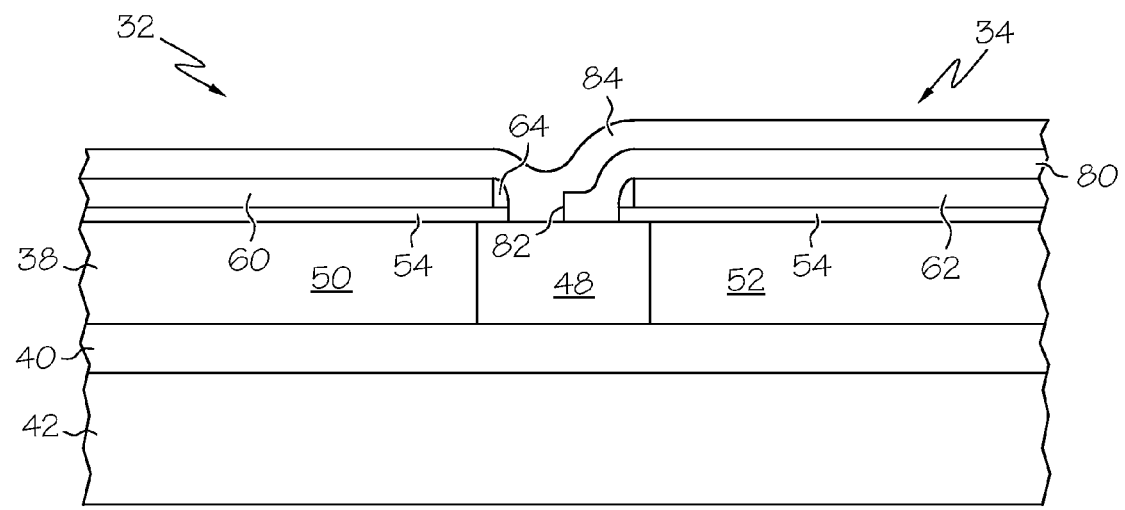

As illustrated in cross section in FIGS. 9 and 10, with the cross sections taken along the same lines as in FIGS. 5 and 6, respectively, a layer of tensile stressed liner material 84 is blanket deposited to overlie NMOS transistor 32, PMOS transistor 34, isolation region 48, and the remaining portion of compressive stress liner 80. As with the compressive stress liner material, the layer of tensile stressed liner material can be any tensile stressed insulating material, and preferably is a layer of tensile stressed silicon nitride having a thickness of about 40-50 nm. The layers of silicon nitride, both compressive stressed and tensile stressed, can be deposited, for example, by LPCVD or PECVD from reactants including dichlorosilane and ammonia. The deposition conditions, reactants, and reactant flows can be adjusted, as is well known, to deposit either a tensile stress liner or a compressive stress liner.

Figure 11:
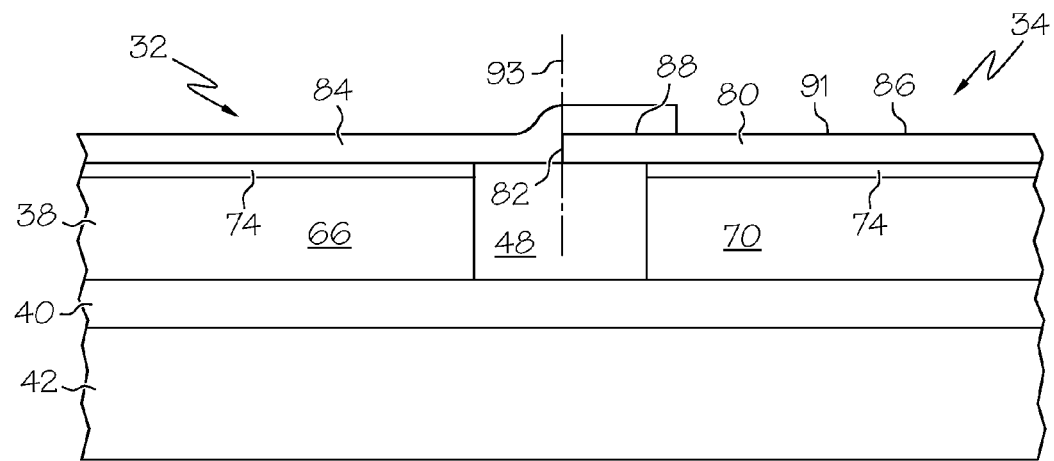
Figure 12:
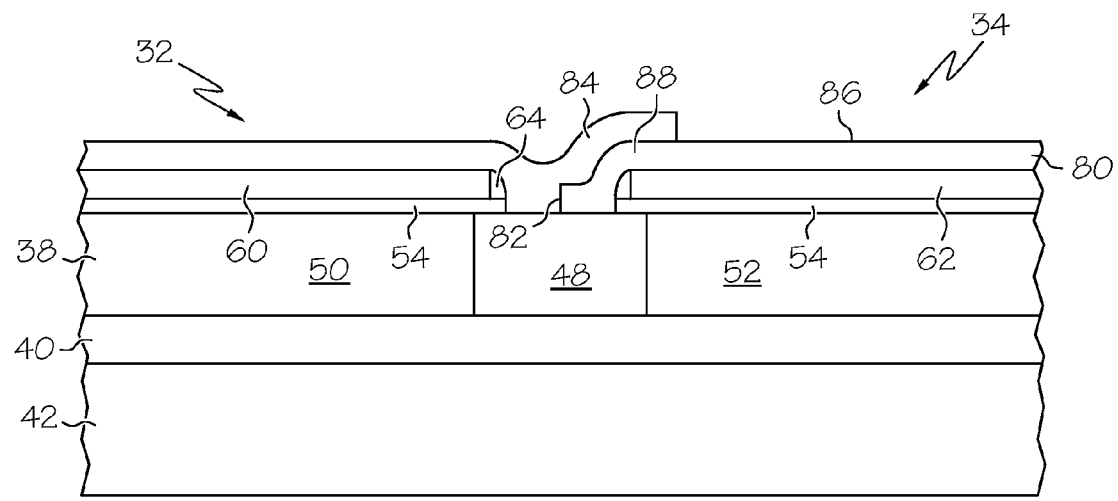

The method continues by the patterning and etching of tensile stress liner 84 as illustrated in cross section in FIGS. 11 and 12, with the cross sections again taken along the same lines as in FIGS. 5 and 6, respectively. Tensile stress liner 84 is preferably patterned and etched to remove a portion of the tensile stress liner material overlying a portion 86 of PMOS transistor 34 and to leave the tensile stress liner overlying NMOS transistor 32, isolation region 48, and a portion 88 of compressive stress liner 80.

By depositing compressive stress liner 80 and patterning the material to remove the material from NMOS transistor 32 and a portion of isolation region 48, a free surface 90 (as illustrated in FIG. 7) is created at the etched edge 82 of compressive stress liner 80 where the compressive transverse stress is relaxed. The relaxation of the compressive effects from the compressive stress liner provides enhanced tensile effects in the transverse direction. After depositing and patterning tensile stress liner 84 the overlap between the tensile stress liner and the remaining compressive stress liner causes the tensile stress liner to be stressed in the transverse direction at the interface between the compressive and tensile stress liners. A free surface 91 as illustrated in FIG. 11 is created for the tensile stress liner, but that free surface is not in the compressive-tensile stress liner interface plane indicated by dashed line 93 in FIG. 11. The out-of-plane tensile stress liner free surface has much less effect on channel stress than would be the case for an in-plane free surface. Accordingly, large tensile transverse stresses are achieved by depositing and patterning the compressive stress liner before the tensile stress liner. Etching is thus used to create a free surface to relax unwanted stress and etching is avoided to preserve beneficial stress. In etching to create a free surface for the beneficial stress liner it is advantageous to locate the etched edge away from the channel region.

Figure 13:
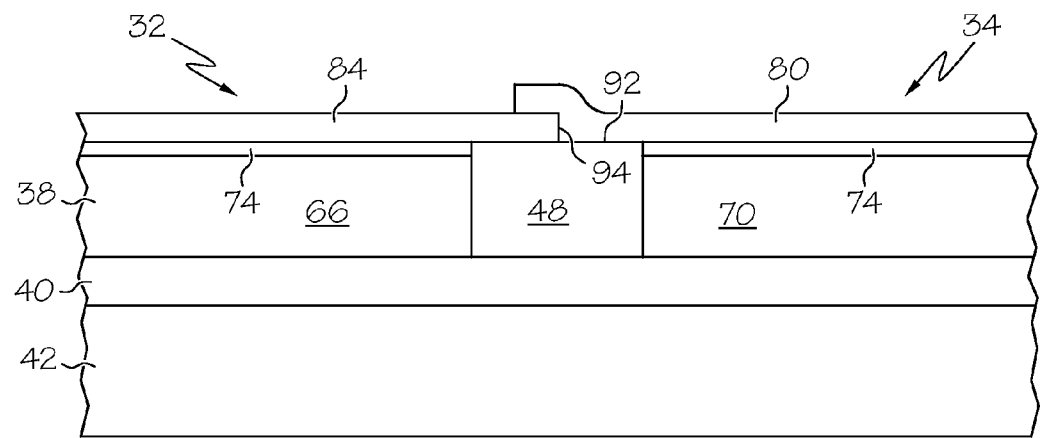
FIG. 13 illustrates, in cross section, a CMOS circuit in accordance with another embodiment.

Although not illustrated, the steps in the foregoing method can be reversed with the tensile stress liner being deposited and patterned first and the compressive stress liner then deposited and patterned. The structure resulting from this embodiment is illustrated in cross section in FIG. 13 with the cross section taken along the same line as in FIG. 5. In accordance with this embodiment, tensile stress liner 84 overlies NMOS transistor 32 and a portion of isolation region 48, leaving a free surface 92 at etched edge 94. Compressive stress liner 80 overlies PMOS transistor 34, isolation region 48, and a portion of tensile stress liner 84. Following reasoning similar to that provided above, this embodiment of the invention provides a tensile stress liner that is relaxed at free surface 92, but the compressive stress liner is not relaxed at the compressive-tensile stress liner interface which results in enhanced compressive transverse stresses.

Although not illustrated, stress enhanced MOS circuit 30 is completed in conventional manner by providing electrical contacts to the source and drain regions and to the gate electrodes. The conventional processing may include, for example, depositing interlayer dielectrics, etching contact vias, filling the contact vias with conductive plugs, and the like as are well known to those of skill in the art of fabricating semiconductor circuits.

Figure 14:
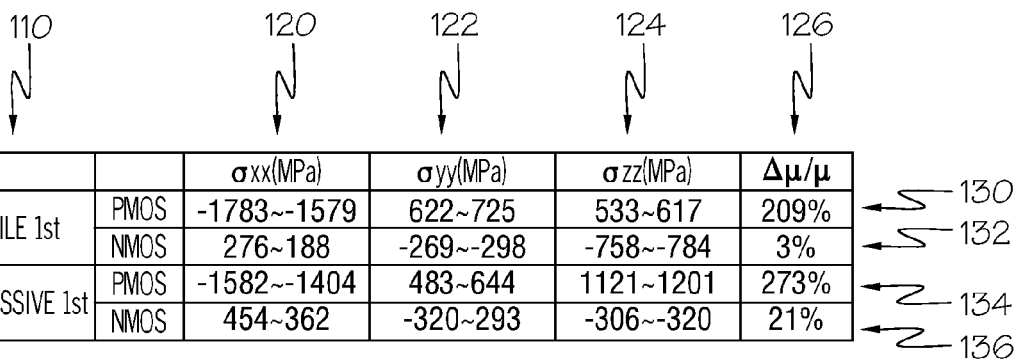
FIG. 14 shows simulated stress and mobility results from practice of embodiments of the invention.

FIG. 14 illustrates the simulated channel stresses and mobility enhancement resulting from fabricating a semiconductor device in accordance with embodiments of the invention and contrasts those results with the results obtained when the tensile stress liner is deposited first. The results are simulated for an ultra thin silicon device fabricated in an SOI film with a thickness of 18 nm. A compressive stress in the compressive stress liner of –2.5 GPa and a tensile stress in the tensile stress liner of 1 GPa were assumed. The devices had a channel width of 300 nm and a channel length of 30 nm. The silicon was of (100) orientation and the channel length was oriented in the [110] direction. The gate oxide was 1 nm in thickness. Stress was measured in the transistor channel 1 nm below the gate oxide. Two stress measurements were made, one in line with the edge of the gate electrode and one in the center of the channel. The electron mobility ($\mu$) and mobility enhancement ($\Delta\mu$) were estimated using an average stress in the channel and bulk piezoresistance coefficients. In the figure column 110 indicates the method followed, either tensile stress liner first followed by compressive stress liner or compressive stress liner first followed by tensile stress liner. Column 120 indicates the resulting longitudinal stress along the channel length, column 122 indicates the resulting vertical stress perpendicular to the channel, column 124 indicates the resulting transverse stress in the channel width direction, and column 126 indicates the mobility enhancement. Rows 130 and 132 indicate the resulting stress and mobility enhancement for a PMOS transistor and an NMOS transistor, respectively, when the tensile stress layer is deposited first. Rows 134 and 136 indicate the resulting stress and mobility enhancement for a PMOS transistor and an NMOS transistor, respectively, when the compressive stress layer is deposited first in accordance with the invention. As can be seen from the figure, the method in which the tensile stress liner is deposited first provides a mobility enhancement for a PMOS transistor whereas the method in accordance with the embodiment of the invention in which the compressive stress liner is deposited first provides a mobility enhancement for both the PMOS transistor and the NMOS transistor.

Figure 15:
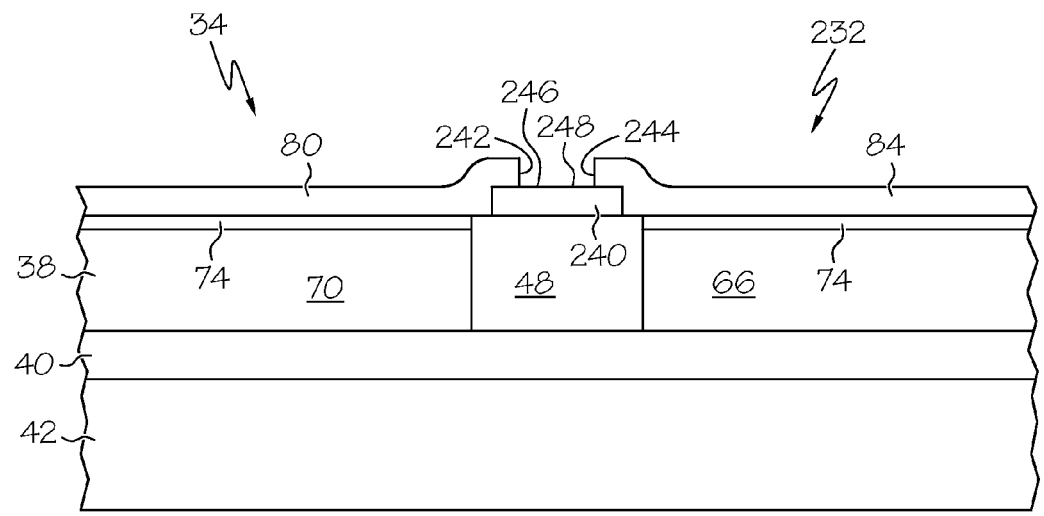
FIG. 15 illustrates, in cross section, a CMOS circuit in accordance with a further embodiment of the invention.

Referring again to FIG. 4, CMOS circuit 30 also includes an NMOS transistor 232 that is adjacent to PMOS transistor 34 but spaced apart in the channel length direction as indicated by arrow 78. NMOS transistor 232 and PMOS transistor 34 are separated by isolation region 48. Longitudinal stress can be optimized in such a structure in accordance with a further embodiment of the invention. Referring again to FIG. 1, majority carrier hole mobility in a PMOS transistor is enhanced by a compressive longitudinal stress, but majority carrier electron mobility in an NMOS transistor is enhanced by a tensile longitudinal stress. Although beneficial for optimizing stress in the transverse direction, when considering stress in the longitudinal direction, depositing a tensile stress liner first enhances mobility of the PMOS transistor, but degrades mobility of the NMOS transistor. Therefore, in accordance with the further embodiment of the invention, a dummy region 240 is provided, as illustrated in cross section in FIG. 15, overlying isolation region 48 between NMOS transistor 232 and PMOS transistor 34. Dummy region 240 can be fabricated, for example, from the same gate electrode forming material 58, preferably polycrystalline silicon, used to form gate electrodes 60 and 62. The dummy region is patterned and etched from gate electrode forming material 58 at the same time gate electrodes 60 and 62 are patterned and etched. During the deposition and patterning of a tensile stress liner and a compressive stress liner, regardless of which liner is deposited first, compressive stress liner 80 is patterned to have an etched edge 242 overlying dummy region 240 and tensile stress liner 84 is patterned to have an etched edge 244 overlying dummy region 240 and spaced apart from etched edge 242. Patterning the compressive stress liner and the tensile stress liner in this manner positions the free surface 246 for the compressive stress liner away from the channel of the PMOS transistor and the free surface 248 for the tensile stress liner away from the channel of the NMOS transistor. Simulation similar to that described above shows that mobility in the PMOS transistor can be improved by about 20% and mobility in the NMOS transistor can be improved marginally if a polycrystalline silicon dummy region is used and the compressive stress liner is deposited first. The increase in mobility is from effects of the enhanced longitudinal stress and is in addition to any increases to be realized from an increase in transverse stress.

The foregoing methods for fabricating stress enhanced MOS circuits can be combined with other methods for inducing mobility enhancing channel stress. For example, trenches etched in the silicon layer in the source and drain regions can be filled by the selective epitaxial growth of a material that has a different lattice constant than the lattice constant of the channel region. For example, the trenches of an NMOS transistor can be filled by the selective epitaxial growth of silicon mixed with up to about 3% carbon to enhance the longitudinal tensile stress in the channel. Similarly, the trenches of a PMOS transistor can be filled by the selective epitaxial growth of silicon admixed with up to about 30% germanium to enhance the longitudinal compressive stress in the channel.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:
1. A CMOS circuit comprising:
a PMOS transistor having a first gate electrode;
an NMOS transistor adjacent the PMOS transistor in a channel width direction, the NMOS transistor having a second gate electrode that is spaced apart from the first gate electrode in the channel width direction and separate from the first gate electrode;
an isolation region that separates the NMOS transistor from the PMOS transistor, the isolation region having a first portion and a second portion;

a compressive stress liner overlying the first gate electrode of the PMOS transistor, not overlying the second portion of the isolation region and contacting the first portion of the isolation region; and a tensile stress liner overlying the second gate electrode of the NMOS transistor, and contacting the second portion of the isolation region, wherein a portion of the compressive stress liner and a portion of the tensile stress liner are in a stacked configuration to define an overlap region of the compressive stress liner and the tensile stress liner at which the portion of the tensile stress liner overlaps with and physically contacts the portion of the compressive stress liner to result in an enhanced transverse stress in the compressive stress liner in the channel width direction, wherein the overlap region is between the first gate electrode and the second gate electrode.

2. The CMOS circuit of claim 1, wherein the portion of the compressive stress liner is an edge portion of the compressive stress liner and wherein the portion of the tensile stress liner overlies the edge portion of the compressive stress liner.

3. The CMOS circuit of claim 1, wherein the first portion is closer to the PMOS transistor and wherein the second portion is closer to the NMOS transistor.

* * * * *